United States Patent [19]
Choi et al.

[11] Patent Number: 5,886,939
[45] Date of Patent: Mar. 23, 1999

[54] SEMICONDUCTOR MEMORY DEVICE HAVING SUB DUMMY BIT LINE AND SUB DUMMY WORD LINE

[75] Inventors: Jong-Hyun Choi, Suwon; Jun-Young Juen, Seoul, both of Rep. of Korea

[73] Assignee: Samsung Electronics, Co., Ltd., Suwon, Rep. of Korea

[21] Appl. No.: 962,528

[22] Filed: Oct. 31, 1997

[30] Foreign Application Priority Data

Oct. 31, 1996 [KR] Rep. of Korea .................. 1996/51150

[51] Int. Cl.⁶ ....................................................... G11C 7/02
[52] U.S. Cl. ................ 365/210; 365/230.03; 365/230.06
[58] Field of Search .............................. 365/210, 230.03, 365/230.66

[56] References Cited

U.S. PATENT DOCUMENTS 5,299,165  3/1994  Kimura et al. ........................... 365/210
5,410,509  4/1995  Morita ..................................... 365/210
5,553,027  9/1996  Von Der Ropp ........................ 365/210
5,652,728  7/1997  Hosotani et al. ........................ 365/210
5,694,369  12/1997 Abe ......................................... 365/210
5,701,269  12/1997 Fujii ........................................ 365/210

Primary Examiner—David Nelms
Assistant Examiner—Tuan T. Nguyen
Attorney, Agent, or Firm—Marger, Johnson, McCollom, P.C.

[57] ABSTRACT

A semiconductor memory device accurately reads out data from a normal unit cell when a short bridge occurs between the normal unit cell and a dummy unit cell. A sub dummy bit line pair DBL/DBLB is interposed between a sub normal bit line and a sub word line driver region (or a strap region). A direct contact (DC) between the dummy unit cell and a sub dummy bit line is eliminated. A data storage capacitor of the dummy unit cell normally connected to a sub dummy bit line DBLB by way of a buried contact is also removed. Thus, operational errors caused by short bridges created between normal and during unit cells are eliminated.

5 Claims, 5 Drawing Sheets

SEMICONDUCTOR MEMORY DEVICE HAVING SUB DUMMY BIT LINE AND SUB DUMMY WORD LINE

BACKGROUND OF THE INVENTION

1. Field of the Invention

The present invention relates to a semiconductor memory device, and more particularly a semiconductor memory device having sub dummy bit lines and sub dummy word lines.

2. Description of the Related Art

A dynamic random access memory (DRAM) includes a plurality of bit lines and word lines perpendicularly intersecting each other. A plurality of unit cells each including one transfer transistor and one data storage capacitor are formed at every intersection of the bit lines and word lines. As DRAM density increases, the area available of the chip for the unit cell and peripheral circuitry is reduced.

Referring to FIG. 1, a common layout for a semiconductor memory device includes a plurality of main memory cell arrays 200. Each memory cell array 200 is divided into a plurality of sub memory cell arrays 300 that each include multiple unit cells 105. A column decoder 103 and a row decoder 101 are arranged respectively at the left and bottom sides of the main memory cell array 200. A peripheral circuit region 100 is used for peripheral circuitry that controls operation of the unit cells 105.

Referring to FIG. 2, a layout of the sub memory cell array 300 and peripheral circuitry includes a sense amplifier region 400, a strap region (not shown), and a sub word line driver region 500 interposed between the adjacent sub memory cell arrays 300. The strap region is a metal wire region formed over the unit cell 105 and a gate polysilicon layer that compensates for time delays in a connected word line. In the sub word line driver region 500, a plurality of driver elements drive the sub word lines.

The strap region and the sub word line driver region 500 raise several manufacturing problems. The sub memory cell array 300 has a higher topology than the adjacent strap region and the adjacent sub word line driver region 500. The different topologies make it difficult to carry out precise layout processes. A diffused reflection of an optical beam during the photolithographic process make it difficult to produce a desired layout for the unit cells 105 on the borders of the sub memory cell arrays 300.

In order to solve such problems, the borders of the sub memory cell array 300 includes sub dummy word lines DWL and sub dummy bit lines DBL that perpendicularly intersect each other. Dummy cells are located at every intersection of the sub dummy word lines DWL and the sub dummy bit lines DBL. The sub dummy word line DWL is usually biased to a ground voltage VSS and the sub dummy bit line DBL is usually biased to a bitline precharge level VCC/2.

Due to process defects, a data storage capacitor connected to the sub dummy bit line DBL may unintentionally be electrically coupled to a data storage capacitor connected to a sub normal bit line NBL. This process defect between nodes causes an undesirable short bridge 121, as shown in FIG. 4. The short bridge 121 causes failures when carrying out performance tests such as burn-in testing.

FIG. 3 is a detailed circuit diagram of the sub memory cell array 300 including the sub dummy word lines DWL and the sub dummy bit lines DBL. The sub dummy bit line DBL is interposed between the sub word line driver region 500 and the sub memory cell array 300. The sub dummy bit line DBL is coupled to transfer transistors 108 by way of direct contact (DC) 107. The transfer transistors 108 and the data storage capacitors 119 constitute dummy unit cells 115a, 115b, 117a and 117b. A normal unit cell 113 has the same structure as the dummy unit cells 115a, 115b, 117a and 117b.

FIG. 4 is a detail circuit diagram of the sub memory cell array 300 showing the dummy unit cell 115b operatively connected to a normal unit cell 116a via the short bridge 121. The transfer transistor 108 of the dummy unit cell 115a has a drain connected to the sub dummy bit line DBL by way of the contact 107, a gate connected to a word line WL0, and a source connected to the data storage capacitor 119 by way of a buried contact. Similarly, the transfer transistor 108 in the dummy unit cell 115b has a drain connected to the sub dummy bit line DBL, a gate connected to a word line WL1, and a source connected to the data storage capacitor 119.

The transfer transistor 108 of the normal unit cell 116a has a drain connected to the normal bit line NBLB, a gate connected to the word line WL2, and a source connected to the data storage capacitor 109. The transfer transistor 108 of the normal unit cell 116b has a drain connected to the normal bit line NBLB, a gate connected to the word line WL3, and a source connected to the data storage capacitor 109.

Process defects can cause the storage capacitor 119 of the dummy unit cell 115b to connect to the storage capacitor 109 of the normal unit cell 116a via the short bridge 121.

When a row address strobe RAS is driven from the logic high level to the logic low level, the dynamic RAM receives an external row address. The row address is processed and transferred to the row decoder 101 shown in FIG. 1, activating a selected one of the word lines WL0–WLn. A few upper bits of the address transferred to the row decoder 101 are used as control signals for controlling the sense amplifier 400 of FIG. 3. The short bridge 121 is not a desired element that exits in the sub memory cell array 300. If a word line WLi (where i=0–n) is activated, data stored in the data storage capacitor 109 is loaded onto the normal bit line NBLB via the transfer transistor 108. The data on the bit line pair BL/BLB is amplified by the sense amplifier 400 and transferred to an input/output line I/O. The data is then transferred to off-chip data processing circuitry.

In the case where the sub memory cell array 300 includes the short bridge 121, the sense amplifier 400 cannot sense (i.e., read out) the data accurately. Namely, the data storage capacitor 109 of the normal unit cell 116a shares the data (i.e., the charge) with the storage capacitor 119 of the dummy unit cell 115b. When the word line WL1 is activated, the data stored into the storage capacitor 109 of the normal unit cell 116a is transferred to the dummy bit line DBL via the transfer transistor 108 of the dummy unit cell 115b. As a result, the data stored in the storage capacitor 109 of the normal unit cell 116a will have an invalid voltage level of VCC/2. If the word line WL2 is activated shortly thereafter, data with the invalid voltage level will be loaded on the normal bit line NBLB. The sense amplifier 400 cannot accurately sense the invalid data.

SUMMARY OF THE INVENTION

It is an object of the present invention to provide a semiconductor memory device that prevents abnormal data reading due to a short bridge between a dummy unit cell and a normal unit cell.

It is another object of the present invention to provide a semiconductor memory device that eliminates a step difference between a cell array region and a peripheral circuit region.

It is still another object of the present invention to provide a semiconductor memory device that ensures uniformity in a photolithographic pattern of a normal unit cell in a memory cell array and a peripheral circuit border.

A sub dummy bit line pair DBL/DBLB are interposed between a sub normal bit line and a sub word line driver region (strap region). A direct contact DC is eliminated that previously connected the dummy unit cell and a sub dummy bit line adjacent to the sub normal bit line. A data storage capacitor is removed in the dummy unit cell that previously connected to the sub dummy bit line DBLB by way of a buried contact. By removing the data storage capacitor previously connected to the dummy bit line DBLB by way of the buried contact along with the buried contact, errors from short bridges are eliminated.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

A preferred embodiment of the present invention will be described in detail hereinbelow with reference to the attached drawings. It should be clearly understood by those skilled in the art that specifics such as the detailed circuit elements are shown only by way of an example to bring a better understanding of the present invention. The present invention may be embodied without those specifics. It should also be noted that detailed descriptions on the related prior art may be intentionally omitted if it is believed to be unnecessary in describing the concepts of the present invention.

Figure 5:
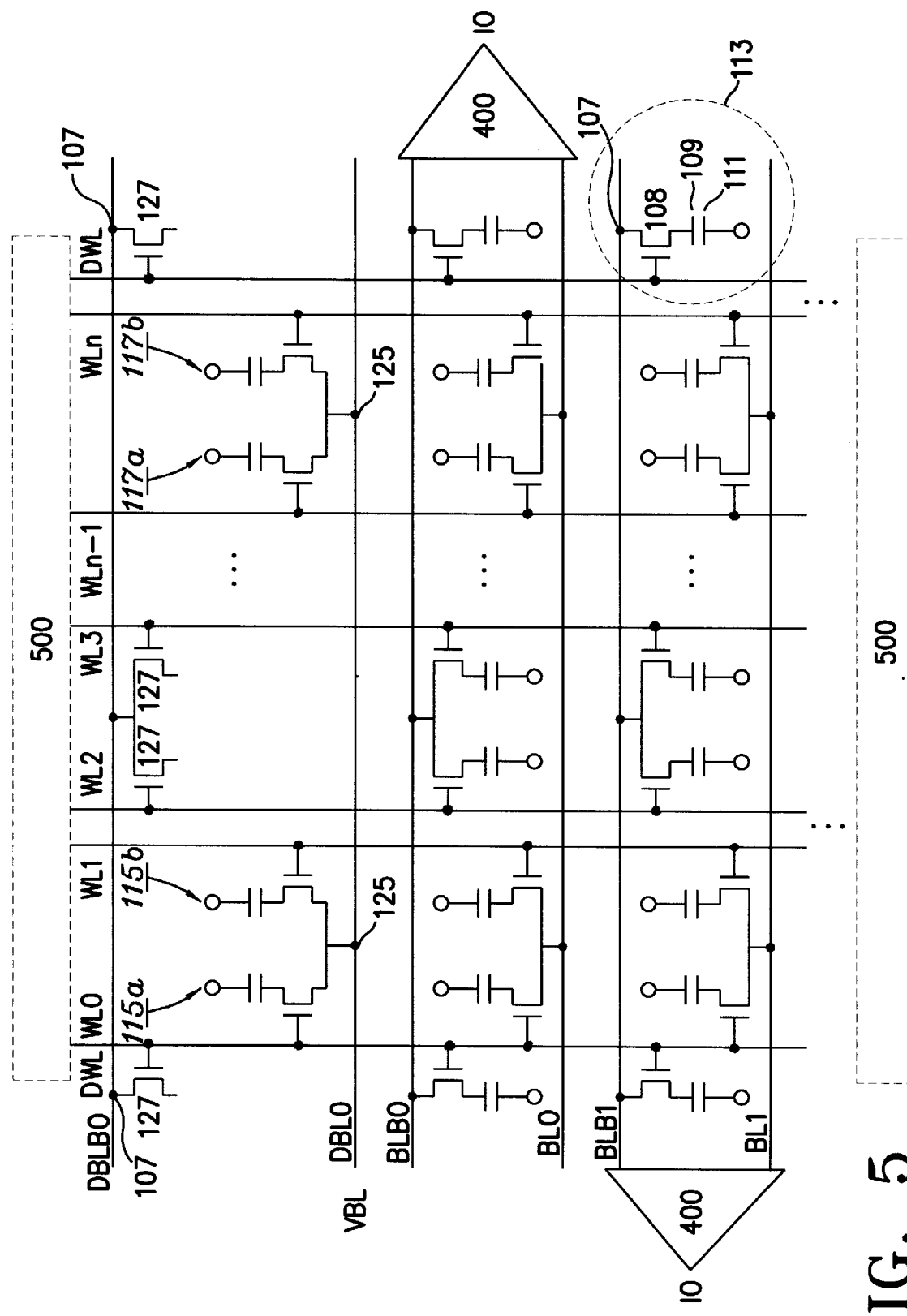
FIG. 5 is a detailed circuit diagram of sub memory cell arrays according to the present invention.

Referring to FIG. 5, a sub memory cell array according to one embodiment of the present invention includes a plurality of sub word lines WL0–WLn arranged vertically between sub word line driver regions 500. Sub dummy word lines DWL are arranged at both outermost sides of the sub memory cell array. A plurality of sub bit lines BL0–BLm are horizontally arranged, intersecting the sub word lines WL0–WLn. A sub dummy bit line pair DBL0/DBLB0 are interposed between the sub normal bit line pair BL0/BLB0 and the sub word line driver region 500. The sub dummy bit lines are provided with a same voltage as a stand-by voltage of the sub normal bit lines.

A plurality of normal unit cells 113 are arranged in a matrix at intersections of the sub normal bit lines BL0–BLm and the sub normal word lines WL0–WLn. Each bit line pair BLi/BLBi (where i=0–m) are connected to an input/output line I/O via a sense amplifier 400.

In order to produce fine, uniform, photolithographic patterns during manufacturing, the sub dummy bit line pair DBL0/DBLB0 are interposed between the sub normal bit line pair BL0/BLB0 and the sub word line driver region 500. The dummy bit line pair DBL0/DBLB0 perpendicularly intersect the sub dummy word lines DWL and the sub normal word lines WL0–WLn. Dummy unit cells 115a, 115b, 117a and 117b are interposed between the sub dummy bit line pair DBL0/DBLB0.

Figure 1:
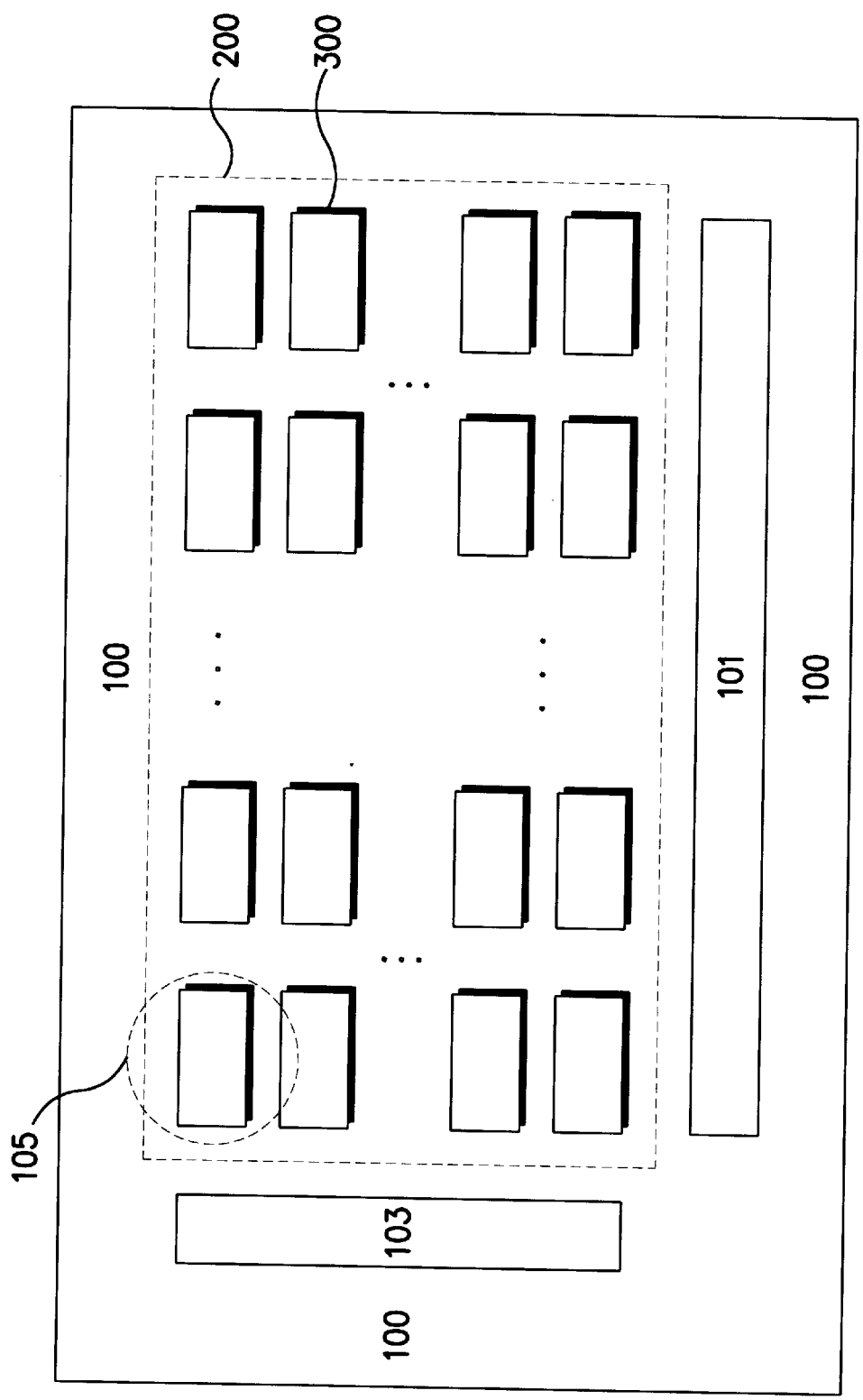
FIG. 1 is a schematic diagram showing a prior art common layout of a semiconductor memory device.
Figure 2:
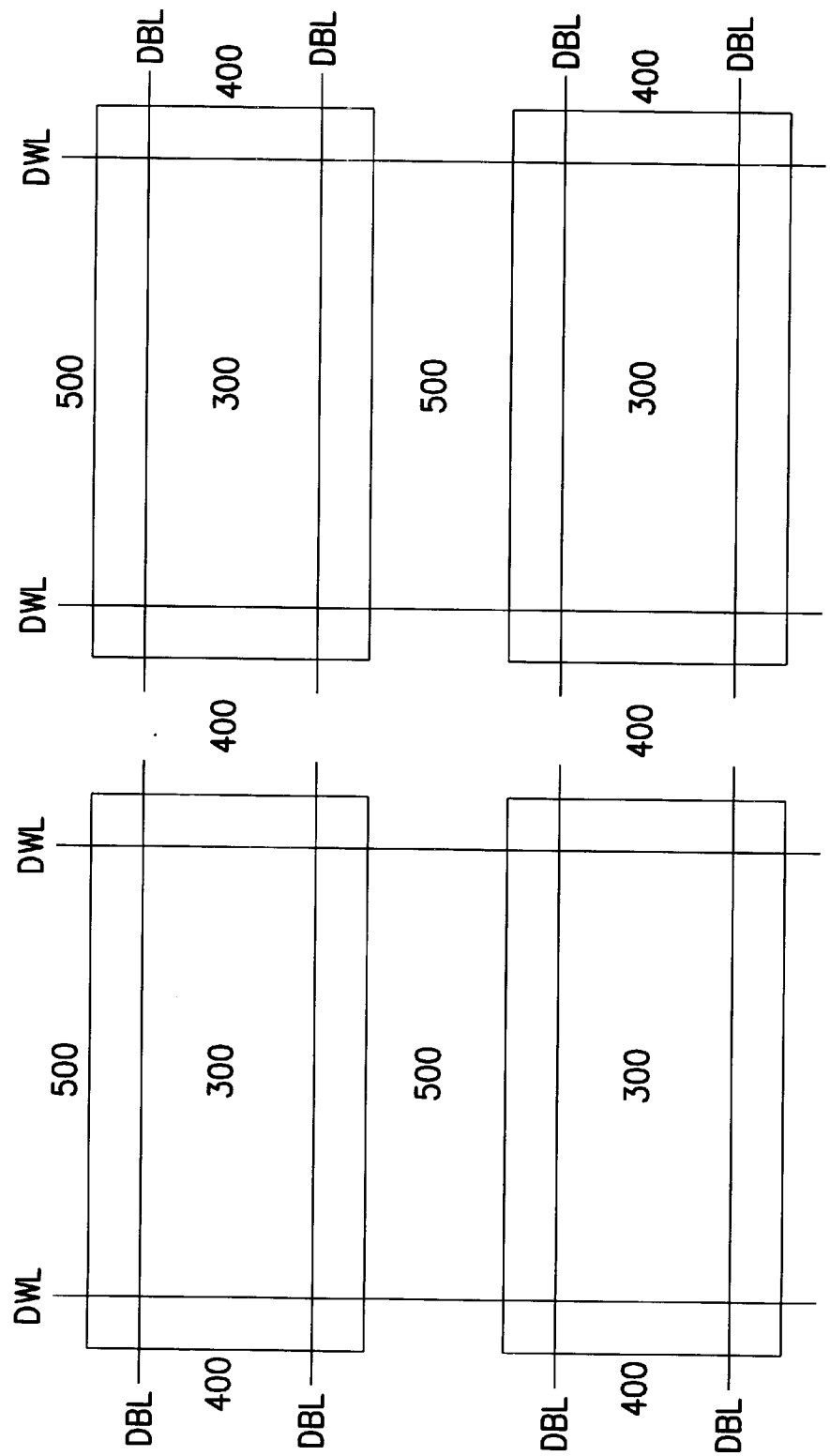
FIG. 2 is a schematic diagram showing layout of a sub memory cell arrays of FIG. 1 and peripheral circuit regions.
Figure 3:
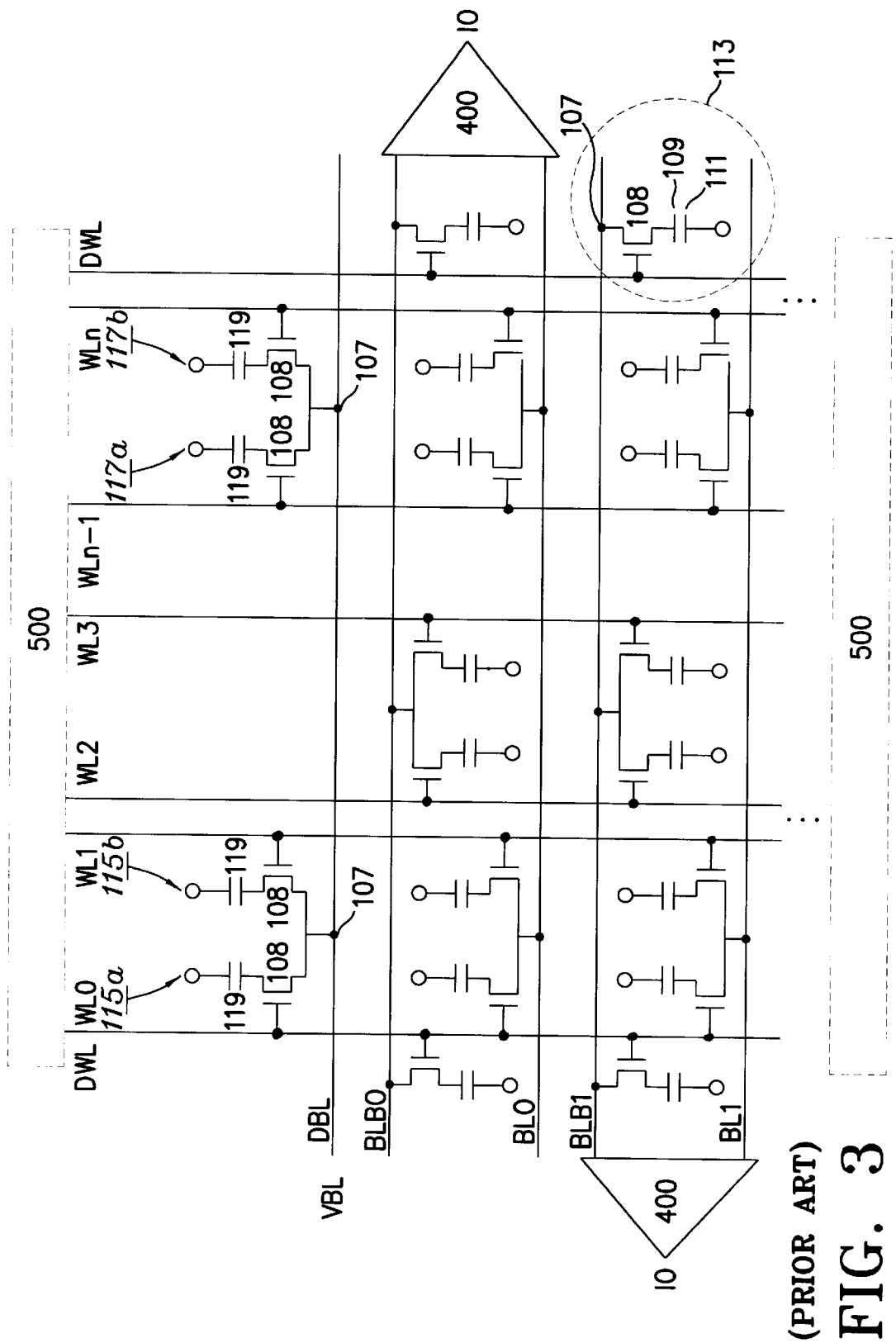
FIG. 3 is a detailed circuit diagram of a sub memory cell array shown in FIG. 2.
Figure 4:
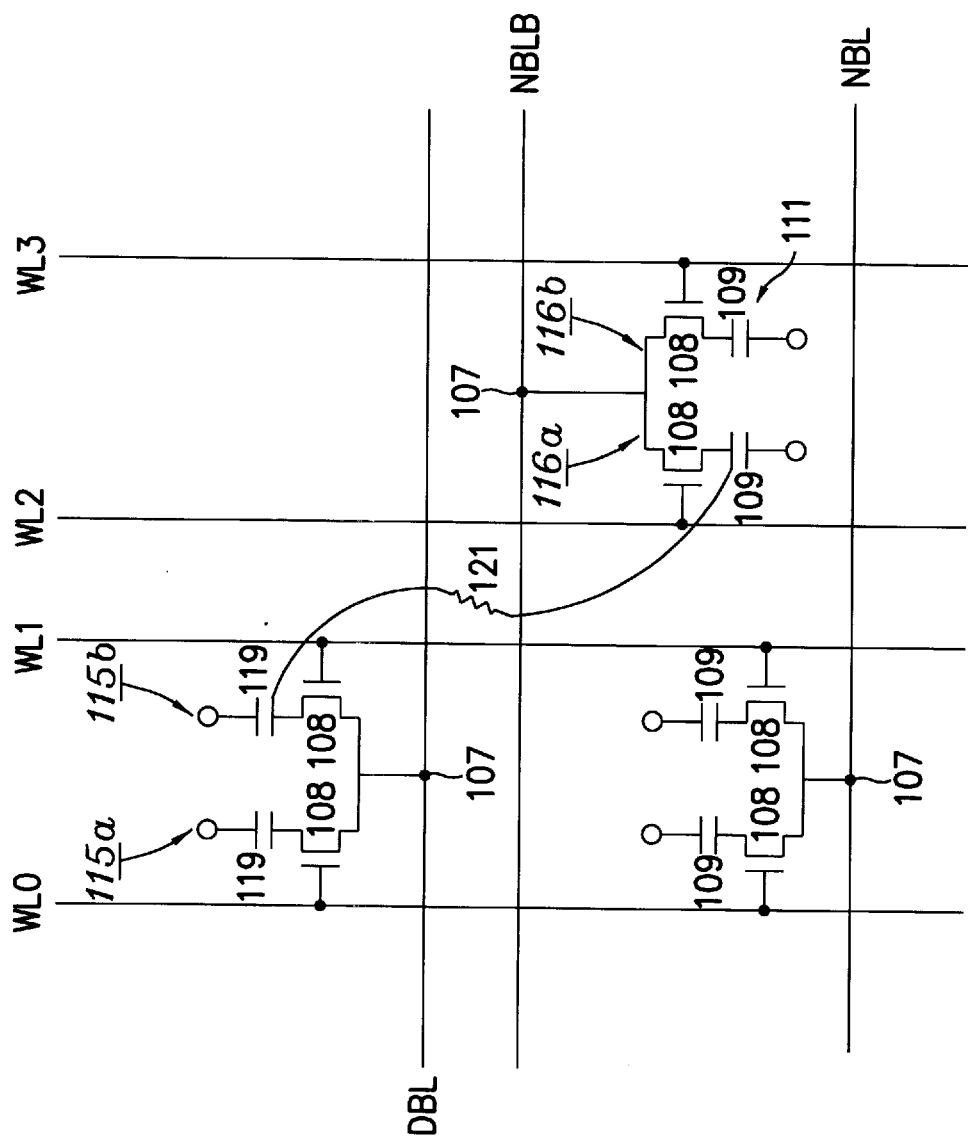
FIG. 4 is a detailed circuit diagram of sub memory cell arrays including a short bridge between a dummy unit cell and a normal unit cell.

In order to prevent abnormal data readings, the direct contacts 107 (shown in FIG. 3) which normally connect the dummy unit cells 115a, 115b, 117a, and 117b to the sub dummy bit line DBL0 are removed (the empty circle labeled 125 in FIG. 5 represents the removed direct contacts 107 previously shown in FIG. 3). Therefore, although a short bridge might occur between the dummy unit cell 115a (or 115b) and the normal unit cell 113, data stored into the normal unit cell 113 will not be lost through the direct contact 125. Namely, data is accurately read out, even when the dummy unit cell is coupled to the normal unit cell via the short bridge.

Furthermore, in accordance with the present invention, storage capacitors are removed that are typically connected to sources of transfer transistors 127 by way of the buried contacts. This makes the topology uniform with the sub word line driver region 500, reducing diffused reflections of optical beams during the photolithographic process. Thus, patterns become stabilized on the borders of the normal unit cells within the sub memory cell array.

The semiconductor memory device can then accurately read out data from a normal unit cell, even when a short bridge occurs between the normal unit cell and a dummy unit cell. Step differences between the sub memory cell array region and the peripheral circuit region are eliminated allowing smaller pattern geometries.

Although various preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor memory device having a memory cell array divided into a plurality of sub memory cell arrays each including a plurality of sub normal bit lines and sub normal word lines intersecting each other, a plurality of normal unit cells being formed at intersections of the sub normal bit lines and the sub normal word lines, and a peripheral circuit adjacent to the sub memory cell array, the peripheral circuit further including a strap region and a sub word line driver region, the memory device further comprising:

at least one sub dummy bit line pair interposed between the peripheral circuit region and an outermost one of the sub normal bit lines, the sub dummy bit line pair perpendicularly intersecting the sub normal word lines and sub dummy word lines, the sub dummy bit line pair being parallel to the sub normal bit lines;

a plurality of dummy unit cells formed at intersections of the sub dummy bit lines with the sub normal word lines and intersections of the sub dummy bit lines with the sub dummy word lines; and the dummy unit cells including a first transistor having a first terminal connected to the sub dummy bit line adjacent to the peripheral circuit and a second terminal disconnected from a buried contact for an associated data storage capacitor and a second transistor having a first terminal connected to the sub dummy word lines and a second terminal disconnected from a buried contact, the dummy unit cells disconnected from the sub dummy bit line adjacent to the outermost sub normal bit line.

2. A semiconductor memory device according to claim 1 wherein the sub dummy bit lines are provided with a same voltage as a stand-by voltage of the sub normal bit lines.

3. A semiconductor memory device according to claim 1 wherein the peripheral circuit and the sub memory cell array have a uniformed topology.

4. A semiconductor memory device, comprising:

a memory cell array divided into a plurality of sub memory cell arrays each including a plurality of sub normal bit lines and sub normal word lines, a plurality of normal unit cells formed at intersections of the sub normal bit lines and the sub normal word lines, and a peripheral circuit adjacent to the sub memory cell array;

at least one sub dummy bit line pair located between the peripheral circuit region and an outermost one of the sub normal bit lines, the sub dummy bit line pair perpendicularly intersecting the sub normal word lines and sub dummy word lines; and a plurality of dummy unit cells formed at intersections of the sub dummy bit lines and the sub normal word lines, the dummy unit cells including a transfer transistor coupled at a first terminal to one of the normal word lines, a second terminal coupled to a dummy storage capacitor and a third terminal disconnected from the sub dummy bit line adjacent to the outermost sub normal bit line.

5. A semiconductor memory device according to claim 4 wherein some of the dummy unit cells have a first terminal connected to one of the dummy word lines, a second terminal coupled to the sub dummy bit line adjacent to the peripheral circuit and a third terminal disconnected from a data storage capacitor.

* * * * *